(12) United States Patent
Raj et al.

(10) Patent No.: US 11,862,240 B2
(45) Date of Patent: Jan. 2, 2024

(54) CIRCUIT STRUCTURE AND RELATED METHOD FOR RADIATION RESISTANT MEMORY CELL

(71) Applicant: GlobalFoundries U.S. Inc., Malta, NY (US)

(72) Inventors: Vivek Raj, Bangalore (IN); Shivraj Gurpadappa Dharne, Bangalore (IN); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 62 days.

(21) Appl. No.: 17/658,189

(22) Filed: Apr. 6, 2022

(65) Prior Publication Data

US 2023/0326520 A1 Oct. 12, 2023

(51) Int. Cl.
*G11C 16/10* (2006.01)
*G11C 11/419* (2006.01)
*H03K 3/356* (2006.01)
*G11C 11/412* (2006.01)

(52) U.S. Cl.
CPC .......... *G11C 11/419* (2013.01); *G11C 11/412* (2013.01); *H03K 3/356026* (2013.01); *H03K 3/356078* (2013.01)

(58) Field of Classification Search
CPC ................ G11C 11/419; G11C 11/412; H03K 3/356026; H03K 3/356078
See application file for complete search history.

(56) References Cited

U.S. PATENT DOCUMENTS

| 6,775,178 | B2 | 8/2004 | Liu et al. |
| 7,233,518 | B2 | 6/2007 | Liu |
| 7,486,538 | B2 | 2/2009 | McCollum |
| 9,947,419 | B1* | 4/2018 | Sinha ..................... G11C 29/02 |
| 2018/0151226 | A1* | 5/2018 | Fujiwara ................ G11C 15/04 |

OTHER PUBLICATIONS

Shiyanovskii et al., "SRAM Cell Design Using Tri-State Devices for SEU Protection," IEEE 2009, Downloaded on Mar. 9, 2022, pp. 114-119.
Yan et al., "Novel Quadruple Cross-Coupled Memory Cell Designs With Protection Against Single Event Upsets and Double-Node Upsets," IEEE Access, vol. 7, published Dec. 6, 2019, 9 pgs.

* cited by examiner

*Primary Examiner* — Xiaochun L Chen
(74) *Attorney, Agent, or Firm* — David Cain; Hoffman Warnick LLC (57) ABSTRACT

Embodiments of the disclosure provide a circuit structure and related method to provide a radiation resistant memory cell. A circuit structure may include a first latch having an input node and an output node. A second latch has an input node and an output node, in which the output node of the second latch is coupled to the input node of the first latch, and the input node of the second latch is coupled to the output node of the first latch. A read/write (R/W) circuit includes a plurality of transistors coupling a word line, a bit line, and an inverted bit line to at least two outputs. One of the at least two outputs is coupled to the input node of the first latch and another of the outputs is coupled to the input node of the second latch.

20 Claims, 5 Drawing Sheets

CIRCUIT STRUCTURE AND RELATED METHOD FOR RADIATION RESISTANT MEMORY CELL

BACKGROUND

One type of digital circuit element is a memory cell, which can be provided as "static RAM" (SRAM) or "dynamic RAM" (DRAM). Several transistors can be electrically connected to each other to provide fundamental elements of a memory cell architecture. Other implementations, e.g., magnetic ram, resistive ram, etc., which lack transistors and/or use transistors to perform distinct functions, are also types of memory cells. In the case of a transistor-based SRAM, the memory cell may include six transistors, four of which can be wired to form two cross-coupled voltage inverters for storing binary digits (also known as "bits") in the form of "high" and "low" voltages, i.e., voltages above or below a predetermined threshold. The remaining two transistors in an SRAM structure are known as "access transistors," so named because these transistors can control electrical access to the SRAM cell during read and write operations. Some portions of a device may be vulnerable to various sources of radiation. In some cases, the radiation may be strong enough to change the voltage level stored within a memory cell.

SUMMARY

The illustrative aspects of the present disclosure are designed to solve the problems herein described and/or other problems not discussed.

Embodiments of the disclosure provide a circuit structure including: a first latch having an input node and an output node; a second latch having an input node and an output node, wherein the output node of the second latch is coupled to the input node of the first latch, and wherein the input node of the second latch is coupled to the output node of the first latch; and a read/write (R/W) circuit including a plurality of transistors coupling a word line, a bit line, and an inverted bit line to at least two outputs, one of the at least two outputs being coupled to the input node of the first latch and another of the at least two outputs being coupled to the input node of the second latch.

Other embodiments of the disclosure provide a circuit structure including: a first latch having an input node and an output node; a second latch having an input node and an output node, wherein the output node of the second latch is coupled to the input node of the first latch, and wherein the input node of the second latch is coupled to the output node of the first latch; and a read/write (R/W) circuit including: a first transistor having a first source/drain (S/D) terminal coupled to a bit line, a second S/D terminal coupled to the input node of the first latch, and a gate terminal coupled to a word line, a second transistor having a first S/D terminal coupled to the bit line, a second S/D terminal coupled to the output node of the first latch, and a gate terminal coupled to the word line, a third transistor having a first S/D terminal coupled to an inverted bit line, a second S/D terminal coupled to the input node of the second latch, and a gate terminal coupled to the word line, and a fourth transistor having a first S/D terminal coupled to the inverted bit line, a second S/D terminal coupled to the output node of the second latch, and a gate terminal coupled to the word line, wherein the R/W circuit is configured to write a same bit to the first latch and the second latch simultaneously.

Additional embodiments of the disclosure provide a method for operating a random access memory (RAM) bit cell, the method including: transmitting a first write signal to an input node of a first latch; and transmitting a second write signal to an input node of a second latch simultaneously with the first write signal; wherein an output node of the first latch is coupled to the input node of the second latch, and an output node of the second latch is coupled to an input node of the first latch, such that transmitting the first write signal and the second write signal causes the first latch and the second latch to simultaneously record a same bit.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a circuit structure and related method for a radiation resistant memory cell. Embodiments of the disclosure may define a portion of a static random access memory (SRAM) bit cell, or other type of non-volatile memory. Non-volatile memory is a memory component that, after having data recorded therein, may be programmed and reprogrammed as many times as a user desires without appreciable loss in operability. Non-volatile memory cells will retain their data even after a device is powered off. Memory cells, including non-volatile memory, may be susceptible to errors if subjected to strong radiation. If doped substrate materials of a transistor are irradiated, the imparted energy may be high enough to convert a low voltage stored in the memory cell to a high voltage or vice versa. Embodiments of the disclosure protect against radiation based errors by using a read/write (R/W) circuit coupled to two cross-coupled latches. The two latches are cross-coupled in that each latch transmits its output as an input to the other latch. The RAY circuit, when writing data to the memory cell, will transmit an identical bit to both latches. If one latch changes its data state independently of the other latch (e.g., due to radiation striking the latch), the other latch will restore its data to the correct value without the RAY circuit re-writing data to the latches.

Figure 1:
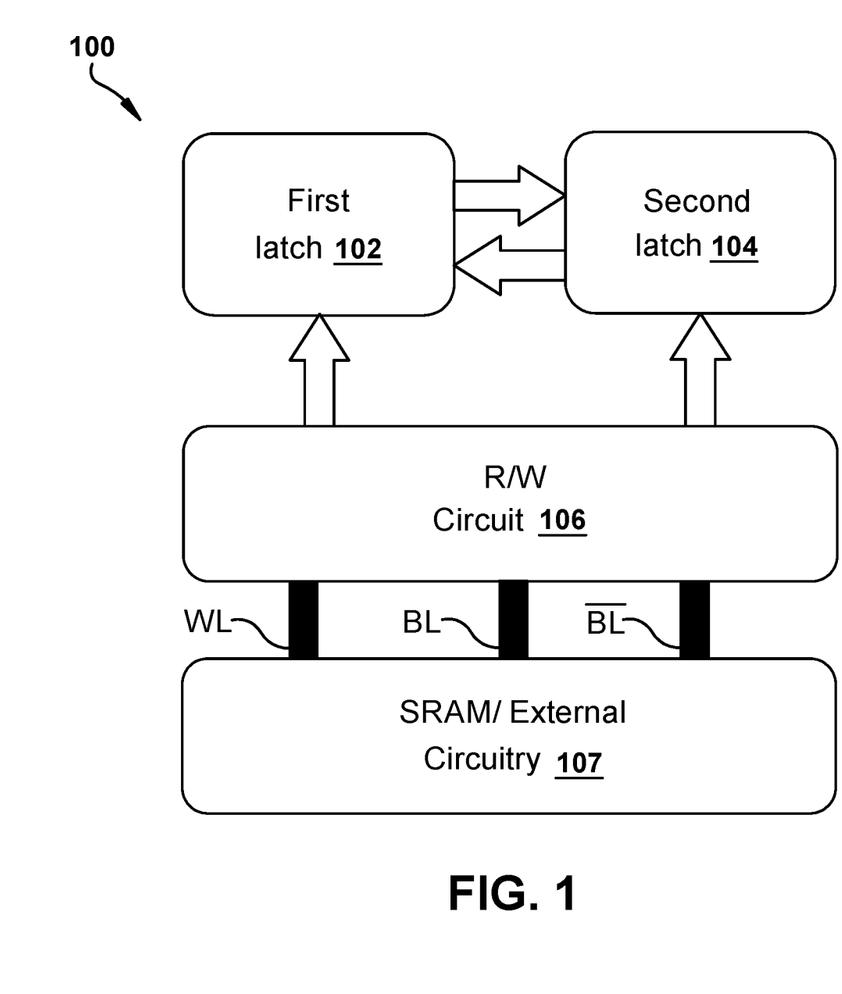
FIG. 1 provides a block diagram a circuit structure according to embodiments of the disclosure.

FIG. 1 provides a schematic block diagram of a circuit structure 100 according to embodiments of the disclosure. Circuit structure 100 may include a first latch 102 and a second latch 104, each of which may store one binary digit ("bit") in the form of a high or low voltage. First latch 102 and second latch 104 may include, e.g., combinations of interconnected transistors for switching between the high and low logic levels according to write signals transmitted to latches 102, 104. A read/write (R/W) circuit 106 may transmit read and write signals to first latch 102 and second latch 104 to record bits as high and low voltage states within first latch 102 and second latch 104. Other portions of a circuit structure transmit read and write signals, including static random access memory (SRAM) control circuitry and/or other forms of external circuitry ("circuitry") 107 coupled to R/W circuit 106 through a word line WL, a bit line BL and an inverted bit line $\overline{BL}$. Word line WL can be set to a word line voltage to control whether R/W circuit 106 will transmit read or write signals to latches 102, 104. The voltage of word line WL thus controls whether bit line BL and an inverted bit line $\overline{BL}$ can write data to, or read data from, latches 102, 104 instead of other memory cells in the same device (e.g., other bit cells coupled to circuitry 107 or included therein). Bit line BL and inverted bit line $\overline{BL}$ transmit signals for reading or writing data in latches 102, 104. Circuitry 107 may transmit high and low voltage signals to R/W circuit 106 through lines WL, BL, $\overline{BL}$ using various control and/or electrical methodologies generally known in the art and thus not discussed in further detail herein.

As indicated generally in FIG. 1, the memory state of first latch 102 is transmitted as an input to second latch 104, and the memory state of second latch 104 is transmitted as an input to first latch 102. Thus, each latch 102, 104 may receive two parallel inputs: a read or write signal from RAY circuit 106, and a signal indicative of the memory state in the other latch 102, 104. During operation, this prevents either of latches 102, 104 from having their memory state changed unless a write signal is transmitted to the other latch at the same time. Among other things, this prevents radiation sufficient to affect the bit stored in either latch 102, 104 from affecting the memory state of the bit cell(s) defined within circuit structure 100. As discussed in further detail herein, each latch 102, 104 is electrically configured such that latches 102, 104 cannot change the value of a bit stored therein unless first latch 102 and second latch 104 are altered at the same time via R/W circuit 106.

Figure 2:
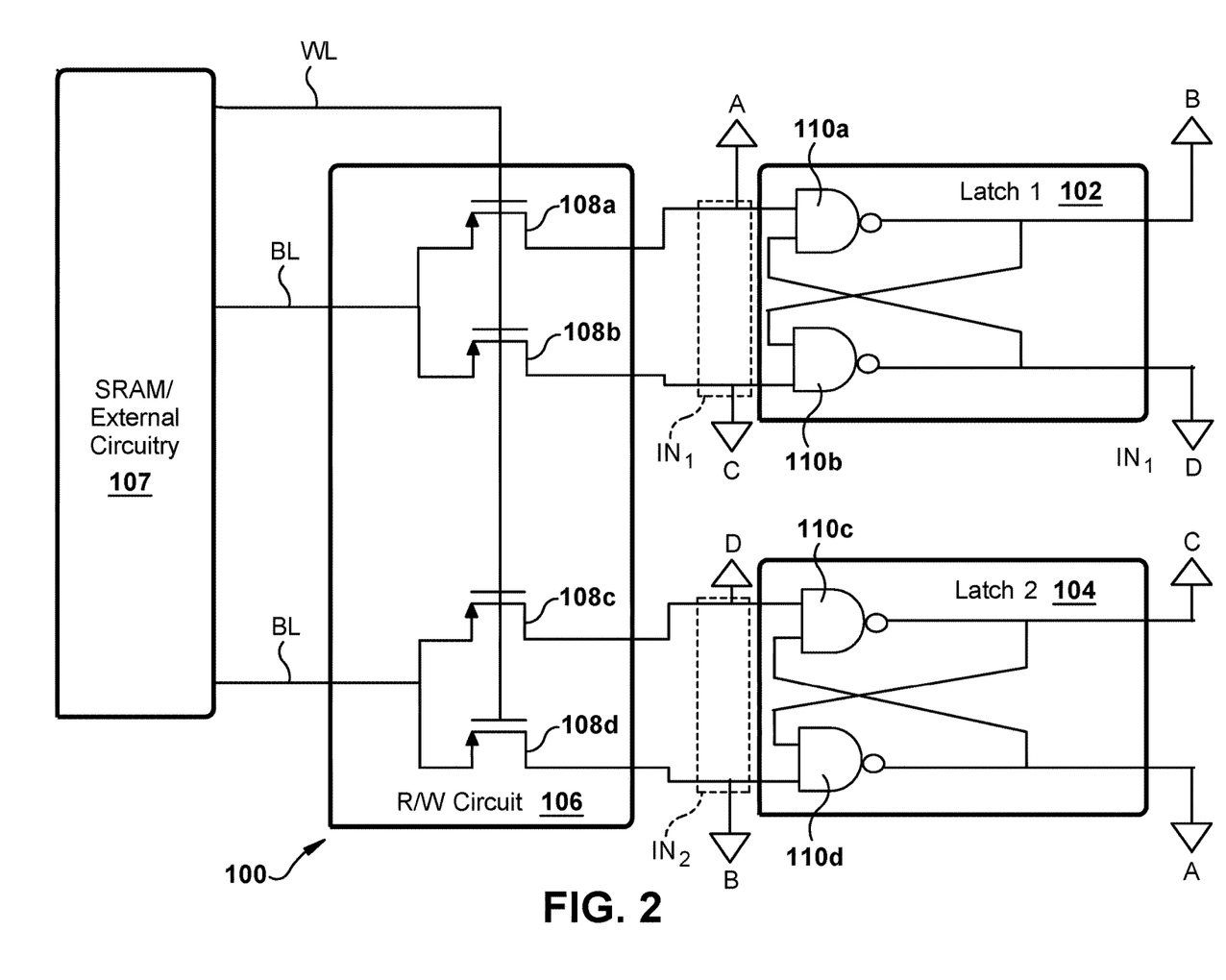
FIG. 2 provides a schematic diagram of a circuit structure according to embodiments of the disclosure.

Turning to FIG. 2, a schematic diagram of circuit structure 100 is shown in which various components and subcomponents of latches 102, 104, and R/W circuit 106 are shown in more detail. RAY circuit 106 may include a plurality of transistors 108 (individually labeled 108a, 108b, 108c, 108d) coupled to word line WL, bit line BL and inverted bit line $\overline{BL}$ at various respective terminals. As discussed elsewhere herein, word line WL, bit line BL and inverted bit line $\overline{BL}$ may be coupled to circuitry 107 (FIG. 1) for selecting whether a respective bit cell will receive a read or write signal, and for transmitting the read and write signals to circuit structure 100. As shown, word line WL can be coupled to the gate terminal of each transistor 108a, 108b, 108c, 108d, such that the voltage of word line WL enables or disables source-drain current through each transistor 108a, 108b, 108c, 108d. Bit line BL may be coupled to the source or drain terminal of two transistors (e.g., transistors 108a, 108c) whereas inverted bit line $\overline{BL}$ may be coupled to the source or drain terminal of two other transistors (e.g., transistors 108b, 108d) of R/W circuit 106. In this manner, applying a threshold voltage via word line WL will selectively allow or prohibit source-drain current flow in each transistor 108a, 108b, 108c, 108d, simultaneously. Bit line BL may be divided in transistors 108a, 108c into two parallel signals transmitted to a first input node $IN_1$ (shown in dashed lines) to latches 102, 104, and inverted bit line $\overline{BL}$ may be divided in transistors 108b, 108d into two parallel signals transmitted to a second input node $IN_2$ (shown in dashed lines) to latches 102, 104.

Each latch 102, 104 may include a pair of cross-coupled negative AND ("NAND") logic gates 110 (separately labeled 110a, 110b, 110c, 110d in FIG. 2). A NAND logic gate refers to a logic gate which outputs a low logic level in response to receiving two high logic inputs, or outputs a high logic level in response to receiving any other combination of logic inputs. The term "cross-coupled," as used herein, refers to the output of one NAND logic gate being transmitted as an input to another NAND logic gate in parallel with incoming signals transmitted from bit line BL or inverted bit line $\overline{BL}$, where applicable. By transmitting a signal from bit line BL and inverted bit line $\overline{BL}$ to first latch 102 and second latch 104, each pair of cross-coupled NAND logic gates 110 (i.e., pair 110a, 110b and pair 110c, 110d) will retain the transmitted logic level within latch 102, 104. Thus, each cross-coupled pair of NAND logic gates 110 can store a binary digit in the form of a retained high or low voltage. The operation of cross-coupled NAND logic gates 110 to create a digital latch is generally known in the art and thus not discussed in further detail herein.

To protect circuit structure 100 from erroneously converting a radiation strike into a change in the memory state of latches 102, 104, latches 102, 104 themselves may be cross-coupled to each other such that the output from first latch 102 is transmitted as an input to second latch 104 and vice versa. To provide this configuration, circuit structure 100 may include a set of shared nodes (indicated by reference signs A, B, C, D) each coupling one output line from first latch 102 or second latch 104 to an input line to a different latch 102, 104. For example, first input node $IN_1$ to first latch 102 may include one input line coupled to shared node A, which in turn is coupled to one output from second latch 104. First input node $IN_1$ may include another input line coupled to shared node C, which in turn is coupled to the other output from second latch 104. Second input node $IN_2$ to second latch 104 may include one input line coupled to shared node B, which in turn is coupled to one output from first latch 102. Second input node $IN_2$ additionally may include another input line coupled to shared node D, which is coupled to the other output from first latch 102. By operation of NAND logic gates 110a, 110b, 110c, 110d, the bit stored in each latch 102, 104 can only be changed when R/W circuit 106 simultaneously transmits an identical write signal to each latch 102, 104. When the same bit is transmitted to each latch 102, 104, each latch 102, 104 will produce an identical output to prevent either latch 102, 104 from returning to its previous state. In the event that only one latch 102, 104 is programmed, the other latch will transmit an opposite output to the other latch 102, 104 and thus restore it to its previous memory state.

Figure 3:
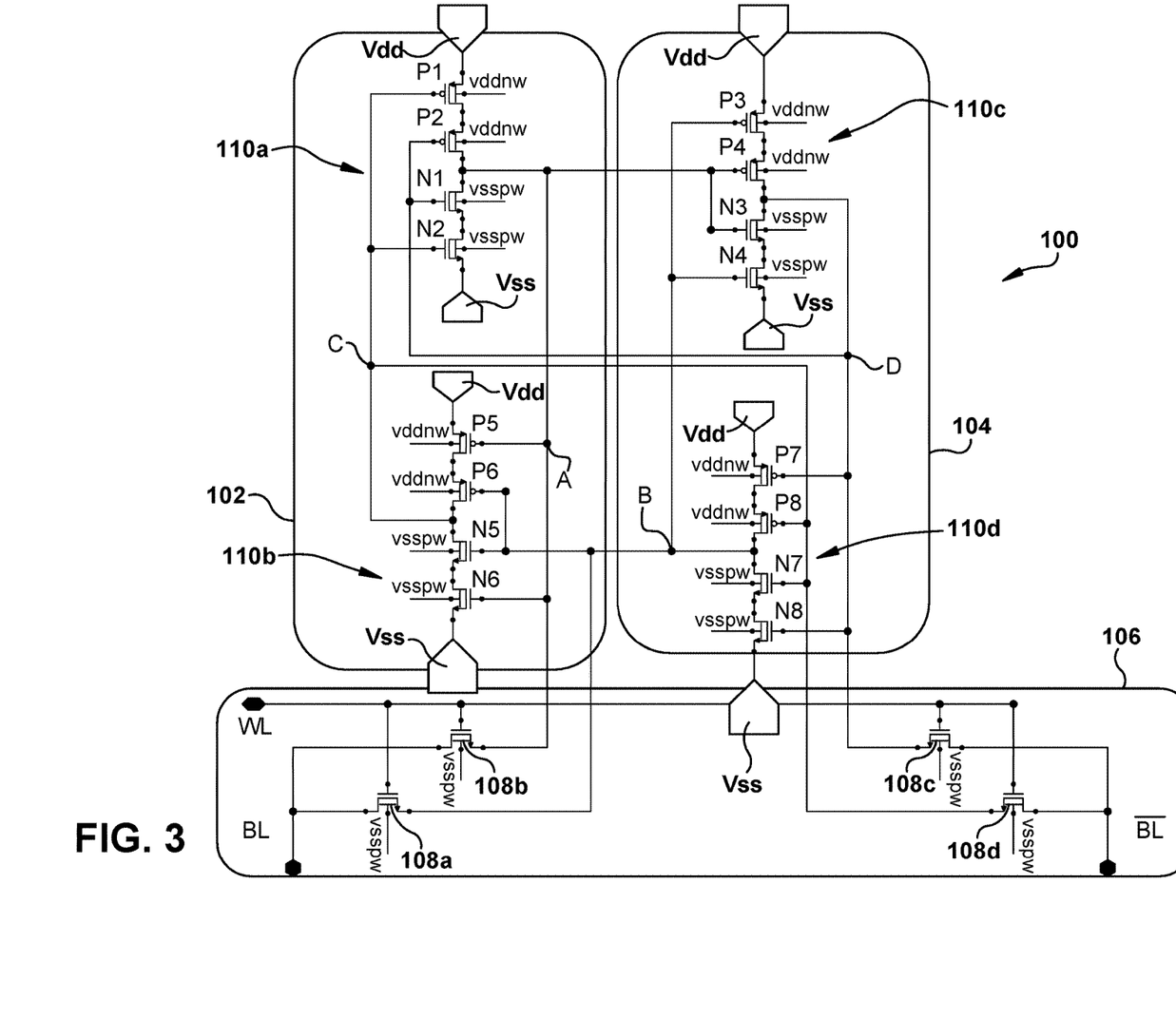
FIG. 3 provides another schematic diagram of a circuit structure according to embodiments of the disclosure.

Turning to FIG. 3, an expanded circuit diagram of circuit structure 100 is shown in further detail to further illustrate possible sub-components of first latch 102, 104, as well as further couplings to various components within first latch 102, second latch 104, and/or R/W circuit 106. According to an example, each NAND logic gate 110a, 110b, 110c, 110d may be implemented using a set of four interconnected transistors, subdivided into oppositely doped pairs. First NAND logic gate 110a may include two p-type transistors (labeled as P1, P2) serially coupled to two n-type transistors (N1, N2) through their source and drain terminals. Second NAND logic gate 110b similarly may have p-type transistors (labeled as P5, P6) coupled to n-type transistors (labeled as N5, N6) in the same configuration. Third NAND logic gate 110c includes the same arrangement through p-type transistors P3, P4 and n-type transistors N3, N4. Fourth NAND logic gate 110d also includes the same arrangement through p-type transistors P7, P8 and n-type transistors N7, N8. In further implementations, latches 102, 104 and/or NAND logic gates 110a, 110b, 110c, 110d may be implemented via any other currently known or later developed combination of transistors and/or electrical components. For instance, each latch 102, 104 may be implemented with combinations of NOR gates, AND-OR gate combinations, AND-NOR gate combinations, and/or other types of logic structures.

Where NAND logic gates 110 are implemented using transistors, each transistor P1-P8, N1-N8 may be defined over a doped semiconductor substrate having an applicable back gate bias, e.g., a source voltage applied to a p-type well ("vsspw" in FIG. 3) or a drain voltage applied to an n-type well ("vddnw" in FIG. 3) to control the threshold voltage needed to operate each transistor of latch 102a, 102b. Moreover, where NAND logic gates 110 are implemented via transistors P1-P8, N1-N8, each group of transistors may be coupled between a respective source voltage Vss and drain voltage Vdd, either of which may be set to a predetermined voltage level. In some implementations, either of source voltage Vss or drain voltage Vdd may be set to a supply voltage (e.g., a voltage source having a voltage output of approximately 0.55 volts (V)) and the other voltage may be set to ground (i.e., a voltage of substantially zero). As further indicated in FIG. 3, each transistor 108a, 108b, 108c, 108d of R/W circuit 106 may also be formed on a doped semiconductor substrate such that its body is biased to a predetermined voltage level (e.g., voltage vsspw discussed herein or another predetermined bias voltage).

First latch 102 being cross-coupled with second latch 104 such that each latch 102, 104 is coupled to circuitry 107 only through R/W circuit 106 additionally may reduce current leakage as compared to conventional memory cell(s) and/or related structures. In an example implementation, latches 102, 104 may yield a current leakage that is at most approximately 1.32 nanoamperes (1.32 mA) during operation.

Figure 4:
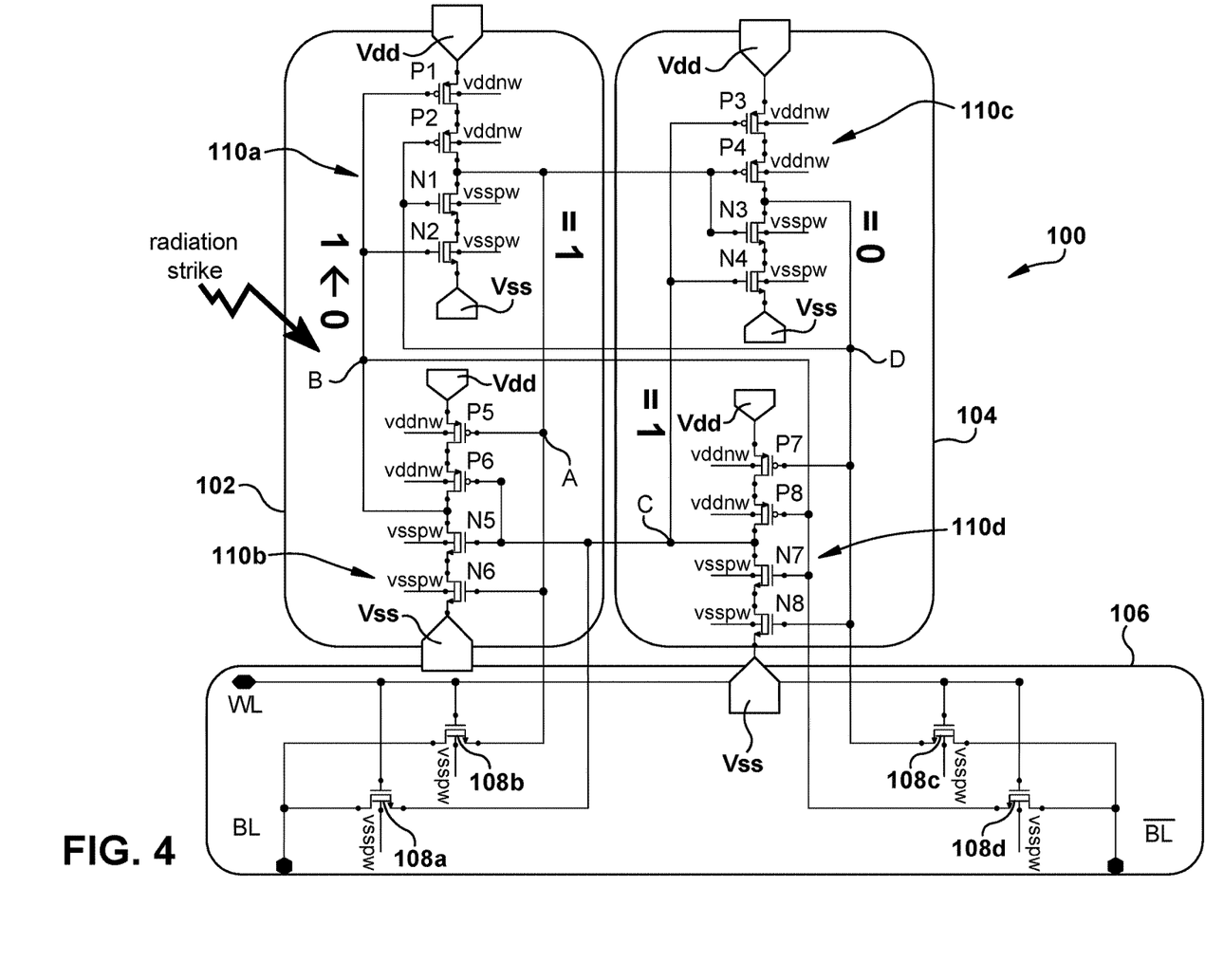
FIG. 4 provides an annotated diagram illustrating a radiation strike on a circuit structure according to embodiments of the disclosure.

FIG. 4 depicts an example of how circuit structure 100 may prevent a radiation strike on first latch 102 from wrongfully recording a change in memory state to first latch 102. It is understood that circuit structure 100 may operate in a corresponding manner to prevent a radiation strike on second latch 104 from wrongfully recording a change in memory state to second latch 104. According to an example, a radiation strike (e.g., emitted from an external electrical source near circuit structure 100) may induce a change in electrical potential in first NAND logic gate 110a that is above the threshold voltage of transistors P1, P2, N1, N2. In this case, the radiation strike may temporarily convert a low voltage (i.e., "0" bit) in transistors P1, P2, N1, N2 into a high voltage (i.e., "1" bit). In turn, NAND logic gate 110a will output this logic level as an input to NAND logic gate 110d via shared node B.

Since the radiation strike did not affect second latch 104, NAND logic gate 110d does not receive a simultaneous write signal from RAY circuit 106 and thus continues to output a low logic level signal (i.e., a "0" bit) to first NAND logic gate 110a. Here, first NAND logic gate 110a receives the output from NAND logic gate 110d and does not receive a write signal from RAY circuit 106. The stored value in first NAND logic gate 110d of first latch 102 thus will immediately revert to the low logic level instead of remaining at the high logic level. Due to all NAND logic gates 110a, 110b, 110c, 110d of first latch 102 and second latch 104 of circuit structure 100 having similar interconnections, a radiation strike on any of latches 102, 104 will not produce a lasting change in the logic level(s) stored in its NAND logic gates 110a, 110b, 110c, 110d and/or transistors P1-P8, N1-N8 due to the absence of a write signal from RAY circuit 106. The coupling between first latch 102 and second latch 104 thus prevents the bits stored in each latch 102, 104 from being different from each other.

Figure 5:
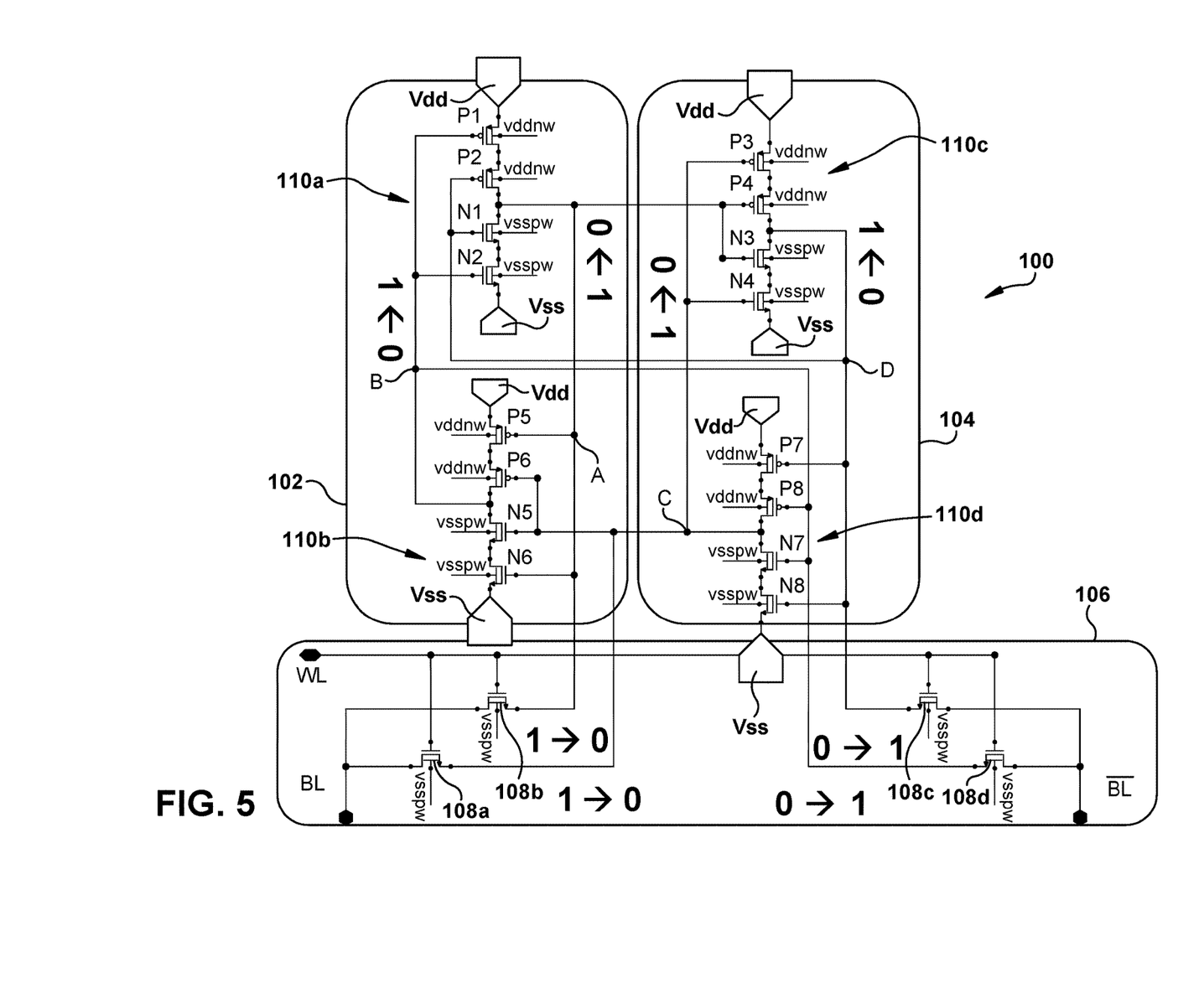
FIG. 5 provides an annotated diagram illustrating a write operation on a circuit structure according to embodiments of the disclosure.

Turning to FIG. 5, embodiments of the disclosure provide circuit structure 100 and a related methodology to protect against radiation strikes, e.g., by causing RAY circuit 106 to simultaneously write the same bit to first latch 102 and second latch 104. Methods according to the disclosure may include, e.g., applying a word line voltage to word line WL to enable current flow through transistors 108a, 108b, 108c, 108d of R/W circuit 106. Bit line BL can then transmit a first write signal to first latch 102 and second latch 104, each for writing a "zero" bit. Inverted bit line $\overline{BL}$ can simultaneously transmit an inverted write signal to first latch 102, 104 to prevent either latch from reverting the recorded bit(s) to their previous state. Bit line BL and inverted bit line $\overline{BL}$ can transmit the first write signal and second write signal through transistors 102a, 102b, 102c, 102d to each latch 102, 104 simultaneously. The incoming signal thus sends a signal to nodes A and C of latches 102, 104 to convert the memory state of each latch 102, 104 from a one to a zero. The simultaneous programming of latches 102, 104 thus converts nodes B and D from a zero to a one, thus preventing either latch 102, 104 from restoring the previous memory state in the other latch through its cross coupled connection(s). Thereafter, word line WL switches to the opposite voltage level to prevent further programming of latches 102, 104 until a subsequent write operation is performed.

The electrical configuration of circuit structure 100 thus allows simultaneous recording of an identical bit in first latch 102 and second latch 104 to prevent radiation strikes and/or other error events from incorrectly changing the bit(s) recorded therein. Additionally, the cross-coupling of latch 102 and second latch 104 restores the previously recorded bit in response to a radiation event or similar error, without RAY circuit 106 transmitting any signals or taking other actions to correct such errors. Methods according to the disclosure thus may include inverting a bit stored in first latch 102 or second latch 104 in response to either latch not having the same bit as the other latch. This inverting of bits may arise from first latch 102 being cross-coupled to second latch 104 and vice versa, thus preventing any changes in the memory state of circuit structure 100 unless implemented through R/W circuit 106.

Embodiments of the disclosure provide various technical and commercial advantages, examples of which are discussed herein. Embodiments of circuit structure 100 and related methods provide resilience to radiation, e.g., by preventing such radiation from incorrectly changing the memory state in circuit structure 100. Circuit structure 100 is configured such that incoming data is simultaneously written to first latch 102 and second latch 104. Additionally, the cross-coupling of first latch 102 and second latch 104 causes either of the latches 102, 104 to restore data in the other latch if external radiation changes the memory state in only one latch. Embodiments of the disclosure thus have proven resilient to voltage spikes having a magnitude of, e.g., up to approximately 1.0 V even when circuit structure 100 is coupled to a substantially lower magnitude voltage supply (e.g., 0.55 V as discussed herein). Due to the compact circuit configuration discussed herein, multiple circuit structures 100 (including latches 102, 104 and RAY circuits 106) may be implemented together at any conceivable scale to provide an array of bit cells suitable for an SRAM memory structure.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A circuit structure comprising:
   a first latch having an input node and an output node;
   a second latch having an input node and an output node, wherein the output node of the second latch is coupled to the input node of the first latch, and wherein the input node of the second latch is coupled to the output node of the first latch; and
   a read/write (R/W) circuit including a plurality of transistors coupling a word line, a bit line, and an inverted bit line to at least two outputs, one of the at least two outputs being coupled to the input node of the first latch and another of the at least two outputs being coupled to the input node of the second latch.

2. The circuit structure of claim 1, wherein the output node of the first latch being coupled to the input node of the second latch and the output node of the second latch being coupled to the input node of the first latch prevents the first latch from storing a different bit from the second latch.

3. The circuit structure of claim 1, wherein the output node of the first latch being coupled to the input node of the second latch causes the first latch to invert a bit stored in the second latch in response to the second latch storing a different bit from the first latch.

4. The circuit structure of claim 1, wherein the output node of the second latch being coupled to the input node of the first latch causes the second latch to invert a bit stored in the first latch in response to the first latch storing a different bit from the second latch.

5. The circuit structure of claim 1, wherein the R/W circuit, the first latch, and the second latch define portions of a static random access memory (SRAM) bit cell.

6. The circuit structure of claim 1, wherein the RAY circuit is configured to write a same bit to the first latch and the second latch simultaneously.

7. The circuit structure of claim 1, wherein the first latch and the second latch are each coupled to a voltage supply having a voltage of at most approximately 0.55 volts (V), and wherein a current leakage from the first latch or the second latch is at most approximately 1.32 nanoamperes (nA).

8. A circuit structure comprising:
   a first latch having an input node and an output node;
   a second latch having an input node and an output node, wherein the output node of the second latch is coupled to the input node of the first latch, and wherein the input node of the second latch is coupled to the output node of the first latch; and
   a read/write (R/W) circuit including:
      a first transistor having a first source/drain (S/D) terminal coupled to a bit line, a second S/D terminal coupled to the input node of the first latch, and a gate terminal coupled to a word line,
      a second transistor having a first S/D terminal coupled to the bit line, a second S/D terminal coupled to the output node of the first latch, and a gate terminal coupled to the word line,
      a third transistor having a first S/D terminal coupled to an inverted bit line, a second S/D terminal coupled to the input node of the second latch, and a gate terminal coupled to the word line, and
      a fourth transistor having a first S/D terminal coupled to the inverted bit line, a second S/D terminal coupled to the output node of the second latch, and a gate terminal coupled to the word line,
   wherein the R/W circuit is configured to write a same bit to the first latch and the second latch simultaneously.

9. The circuit structure of claim 8, wherein the output node of the first latch being coupled to the input node of the second latch and the output node of the second latch being coupled to the input node of the first latch prevents the first latch from storing a different bit from the second latch.

10. The circuit structure of claim 8, wherein the output node of the first latch being coupled to the input node of the second latch causes the first latch to invert a bit stored in the second latch in response to the second latch storing a different bit from the first latch.

11. The circuit structure of claim 8, wherein the output node of the second latch being coupled to the input node of the first latch causes the second latch to invert a bit stored in the first latch in response to the first latch storing a different bit from the second latch.

12. The circuit structure of claim 8, wherein the RAY circuit, the first latch, and the second latch define portions of a static random access memory (SRAM) bit cell.

13. The circuit structure of claim 8, wherein a current leakage from the first latch or the second latch is at most approximately 1.32 nanoamperes (nA).

14. The circuit structure of claim 8, wherein the first latch and the second latch are each coupled to a voltage supply having a voltage of at most approximately 0.55 volts (V).

15. A method for operating a random access memory (RAM) bit cell, the method comprising:
   transmitting a first write signal to an input node of a first latch; and
   transmitting a second write signal to an input node of a second latch simultaneously with the first write signal;
   wherein an output node of the first latch is coupled to the input node of the second latch, and an output node of the second latch is coupled to an input node of the first latch, such that transmitting the first write signal and the second write signal causes the first latch and the second latch to simultaneously record a same bit.

16. The method of claim 15, further comprising inverting a bit stored in the second latch in response to the second latch having a different bit from the first latch.

17. The method of claim 15, further comprising inverting a bit stored in the first latch in response to the second latch having a different bit from the second latch.

18. The method of claim 15, further comprising transmitting a word line voltage to a read/write (R/W) circuit coupled to the first latch and the second latch to enable transmitting of the first write signal and the second write signal.

19. The method of claim 15, wherein the first write signal is transmitted from a bit line, and wherein the second write signal is transmitted from an inverted bit line.

20. The method of claim 15, further comprising applying a supply voltage of at most approximately 0.55 volts (V) to the first latch and the second latch while transmitting the first write signal and the second write signal.

* * * * *